United States Patent [19]
Arnold

[11] Patent Number: 6,150,210
[45] Date of Patent: Nov. 21, 2000

[54] MEMORY CELL THAT INCLUDES A VERTICAL TRANSISTOR AND A TRENCH CAPACITOR

[75] Inventor: Norbert Arnold, New Hempstead, N.Y.

[73] Assignee: Siemens Aktiengesellschaft, Munich, Germany

[21] Appl. No.: 09/272,218

[22] Filed: Mar. 18, 1999

Related U.S. Application Data

[62] Division of application No. 08/770,962, Dec. 20, 1996, Pat. No. 5,937,296.

[51] Int. Cl.$^7$ .................................................. H01L 21/8242
[52] U.S. Cl. ......................... 438/243; 438/241; 438/164; 438/249; 438/259; 438/268
[58] Field of Search .................................... 438/268, 259, 438/249, 241, 243, 164

[56] References Cited

U.S. PATENT DOCUMENTS 5,618,745  4/1997  Kita .......................... 438/164
5,844,266  12/1998  Stengl et al. ............... 257/301

*Primary Examiner*—Richard Booth
*Assistant Examiner*—Olivia Luk
*Attorney, Agent, or Firm*—Stanton Braden

[57] ABSTRACT

A memory cell for a dynamic random access memory includes a pass transistor and a storage capacitor. The transistor is a vertical transistor formed along an upper portion of a sidewall of a polysilicon-filled trench in a monocrystalline silicon body with the source and drain in the body and the source contact, gate and gate contact in the trench, with its gate dielectric being an oxide layer on the sidewall portion of the trench. The capacitor is a vertical capacitor formed along a deeper portion of the trench and has as its storage plate a lower polysilicon layer in the trench and as its reference plate a deep doped well in the body. The source contact and the storage plate are in electrical contact in the trench and the source contact and the gate contact are in the trench electrically isolated from one another.

5 Claims, 12 Drawing Sheets

MEMORY CELL THAT INCLUDES A VERTICAL TRANSISTOR AND A TRENCH CAPACITOR

This is a divisional of application Ser. No. 08/770,962 filed Dec. 20, 1996, now U.S. Pat. No. 5,937,296.

FIELD OF THE INVENTION

This invention relates generally to a memory cell, and more particularly, to a memory cell useful in a dynamic random access memory (DRAM).

BACKGROUND OF THE INVENTION

A DRAM generally includes a two-dimensional array of rows and columns of memory cells integrated in a semiconductive chip. A popularly used memory cell with n-channel metal-oxide-silicon (MOS) DRAMs is the "switched capacitor" memory cell which has a n-channel MOS transistor (also denoted as a pass transistor) and a capacitor (also denoted as a storage device). One output terminal of the transistor is coupled to a first terminal (storage plate) of the capacitor and the second terminal (reference plate) of the capacitor is typically coupled to a fixed voltage source. The gates of all of the transistors of a common row of memory cells are coupled to a common word line and the second output terminals of the pass transistors of a column of memory cells are all coupled to a common separate bit line. In a n-channel MOS transistor positive current is defined as flowing along the channel from the drain to the source output terminals. During operation of the switched capacitor memory cell current reverses through the transistor and thus the drain and source reverse. For the sake of discussion herein the first output terminal of the pass transistor shall be denoted as the source and the second output terminal shall be denoted as the drain.

In its early form, both the channel of the pass transistor and the storage surface of the capacitor extended largely horizontally along the active surface area of the chip. This latter characteristic was found to limit the density with which the memory cells could be packed in a single chip because, to achieve the desired amount of capacitance necessary for reliability, it was important to use considerable active surface area for the capacitor.

To meet this problem, it has become the practice to employ in high density DRAMs a memory cell that uses a capacitor whose storage surface extends essentially perpendicular to the active surface area, typically in a trough (trench) that extends vertically in the chip so that the capacitance can be increased as needed, simply by extending the depth of the trench with little effect on the chip surface area consumed by the capacitor.

In U.S. Pat. No. 5,376,575, which issued on Dec. 27, 1994, there is proposed a DRAM that reverses this approach and employs a storage capacitor at the active surface of the chip whose storage surface extends parallel to the active surface and a buried pass transistor that underlies the storage capacitor and whose channel extends vertically in a trench that extends vertically from the active surface. This design permits the bit line that normally extends over the active surface of the chip to be buried in the interior of the chip, thereby saving the area of the active surface of the chip formerly occupied by the bit line. Additionally, the vertical orientation of the transistor permits the length of the channel of the transistor to be increased, as needed, to avoid undesirable short-channel effects that generally limit how much the channel length can be effectively shortened. However, the burial of the bit lines can complicate the fabrication process, particularly in dense arrays where each bit line needs to serve all the cells in a column. Presently there is known no report in the literature of a memory cell of this kind, but its manufacture would appear to be difficult for use in state of the art DRAMs.

Another problem that arises with increasing the density of memory cells in an array is the increasing difficulty in achieving consistently the alignment required of the various processes involved in the commercial manufacture of such arrays.

It is desirable to have a switched capacitor memory cell that requires relatively little semiconductor surface area, has adequate capacitance, and can be fabricated relatively easily.

SUMMARY OF THE INVENTION

The present invention relates to a novel memory cell structure and a process to fabricate such structure. The structure facilitates the simplification of processes in the fabrication of high density DRAMs.

An illustrative embodiment of the invention is embodied in a chip that comprises a silicon body. Typically the silicon body may have been cut from a monocrystalline silicon wafer or been formed as an epitaxial layer grown either on a silicon layer or an insulating substrate, such as sapphire. The invention permits the more critical steps of the processing, such as those involving minimum area lithography to be done advantageously early in the processing where better planarity is available. Additionally, invention permits the increased use of self-alignment processes that simplify achieving the close alignment required in the manufacture of high-density DRAMs.

One embodiment of the invention comprises a memory cell that uses a vertical trench in which a lower portion helps form a vertical capacitor and an upper portion helps form a vertical transistor. The memory cell is formed in a chip that includes a silicon substrate, which for example is monocrystalline in structure. The silicon substrate comprises a polysilicon-filled vertical trench and a pass transistor comprising a source, drain, channel, and gate. The source, drain, and channel are formed in an upper portion of the monocrystalline substrate and the gate is formed in an upper portion of the polysilicon-filled trench with the gate dielectric as a layer of oxide along an upper sidewall portion of the trench. The storage capacitor of the memory cell has a storage plate in a lower portion of the polysilicon-filled trench, a reference plate in a lower portion of the monocrystalline substrate, and a dielectric layer along a lower wall portion of the trench.

In an alternative embodiment, the pass transistor is largely located in the monocrystalline substrate in a shallow region (well) of one conductivity type and the storage capacitor is largely located in the monocrystalline substrate in a deeper region (well) of the opposite conductivity type. Additionally, the active area of each memory cell at the surface of the chip is defined by a shallow isolation trench filled with dielectric, typically silicon oxide.

In another embodiment, the transistor and capacitor are formed in a chip that comprises a silicon body comprising a monocrystalline substrate and a vertical polysilicon-filled trench. The transistor has a source and drain vertically spaced-apart along a channel extending in the body along a sidewall portion of the polysilicon-filled trench, and a gate located in the polysilicon fill and has gate dielectric which lies along the sidewall portion of the polysilicon-filled trench. The capacitor has a storage plate in the polysilicon fill, a reference plate in the monocrystalline substrate, and a dielectric layer on a wall portion of the polysilicon-filled trench between the reference plate and the storage plate. The transistor is located above the capacitor in the silicon body.

In still another embodiment, the invention comprises a memory cell having a capacitor and a n-channel field effect transistor having a drain, a source, and a gate. The memory cell is formed in a silicon chip that comprises a silicon body having a major surface and comprising a monocrystalline substrate and a vertical polysilicon-filled trench. The transistor has the source and drain thereof spaced apart vertically in the body along a channel extending in the substrate along a sidewall portion of the polysilicon-filled trench, the gate in the polycrystalline-filled trench, and the gate dielectric along the sidewall portion of the polysilicon-filled trench. The capacitor has a storage plate in the polysilicon-filled trench, a reference plate in the monocrystalline substrate, and a dielectric thereof in an insulating layer on a sidewall portion of the polysilicon-filled trench between said reference plate and said storage plate. The transistor is located above the capacitor in the silicon body and has a portion thereof that is on the major surface.

As previously discussed, the invention is also directed to a process for fabricating the memory cell. The process comprises etching a vertical trench in a semiconductive body and filling it such that a vertical capacitor and vertical transistor are formed in the lower and upper portions of the trench, respectively. The formation of the capacitor in the lower portion and the vertical transistor in the upper portion simplifies the fabrication process. To illustrate, the cell is formed by filling the trench in a succession of steps with polysilicon layers and dielectric layers such that the deepest polysilicon layer in the trench forms a storage capacitor with a layer in the substrate, an intermediate depth polysilicon layer in the trench forms a contact for a source of the transistor in the substrate, a shallow polysilicon layer formed in the trench serves as the gate of the transistor, and a dielectric layer formed on a sidewall of the trench serves as the gate dielectric. Moreover, as a consequence of these steps, the channel of the transistor extends from the source to the drain in the substrate along a portion of sidewall of the trench where there was formed the gate dielectric.

In one embodiment, shallow isolation trenches are first formed to define the active areas of the cell. The shallow trenches are filled with a suitable dielectric, such as silicon oxide. Bit line drain contacts of the cells are then formed. The contacts comprise forming multiple-layer stacks largely over the shallow isolation trenches such that the overlap of a stack over an active area defines the drain region of a pass transistor. As such, the need for a separate drain contact mask in the fabrication is avoided. Additionally, the invention allows for the word line contact regions to be defined early in the processing by troughs in a glassy layer between the bit line columns over the active regions and the successive vertical-trench etching operations are defined by the previously formed bit line columns and word line contact troughs, thereby avoiding the need for separate masks to define the etching of the vertical trenches.

In another embodiment, a process for forming vertical trenches in a semiconductive body is desclosed. The process comprises the steps of: forming over the top surface of the body an array of columns of bit lines, each including a conductive portion and a dielectric cap; filling the gaps between the columns with a dielectric fill; etching troughs in the dielectric fill down to the top surface of the semiconductive body; and using the array of parallel columns and the remaining dielectric fill as a mask to etch the vertical trenches.

In yet another embodiment, a process for forming a trench that has a deeper portion of cross section larger than that of a shallower portion is described. Formation of such a trench comprises first etching anisotropically in the semiconductive body a trench and then coating the trench with an etch-resistant layer. The etch resistant layer is removed from the bottom of the trench and then the trench is etched anisotropically to deepen the trench further. This is followed by an isotropic etching step that serves to widen the deepened portion not protected by the etch resistant coating.

Another embodiment of the invention is directed to a process for forming a trench in a semiconductive body that has a shallow portion having a first cross section and a deeper portion having a second cross section larger than the first cross section. The process comprises the steps of: etching a selected surface portion of the body to form a trench of a first depth and the first cross section; coating the sidewalls of the trench with an etch resistant coating; etching the selected surface portion of the body anisotropically to deepen the trench; and etching the selected surface portion of the body isotropicallly to widen the trench such that the deeper portion of the trench has the second cross section which is larger than the first cross section.

In still another embodiment, the invention is directed to a process for making a memory cell for use in a DRAM that includes a pass transistor and a storage capacitor. The process comprises the steps of forming a vertical trench in a monocrystalline semiconductive substrate; providing a first deepest polycrystalline semiconductive layer in the trench that is dielectrically isolated from the surrounding monocrystalline substrate for forming a buried vertical storage capacitor; providing a second intermediate-depth polycrystalline semiconductive layer in the trench that is electrically connected to the first deepest layer and to a doped region in the monocrystalline substrate for serving as one output terminal of the pass transistor; providing a third shallowest polycrystalline semiconductive layer in the trench that is dielectrically isolated from the second polycrystalline layer and from the adjacent monocrystalline semiconductive substrate by the gate dielectric of the pass transistor for serving as the gate and gate contact of the pass transistor and creating a channel in the adjacent region of the monocrystalline semiconductive substrate; and providing a doped region in the monocrystalline semiconductive substrate at the upper end of the channel for serving as a second output terminal of the pass transistor.

In yet still another embodiment, the present invention is directed to a process for forming an array of memory cells wherein a cell comprises a pass transistor and a storage capacitor for a dynamic random access memory. The array of cells is located in a portion of a silicon body in which there have been formed p-type and n-type conductivity wells and in which active areas for the cells have been defined and isolated. The process comprises the steps of: forming at the top surface of the silicon body a source/drain for the pass transistor of each memory cell; forming vertically in each active area a trench of a first depth that passes through a surface well of a first conductivity type and a buried well of the opposite conductivity type; forming in each trench a first dielectric layer useful as the dielectric layer of a storage capacitor on a sidewall along a portion of the trench in the buried well; providing in each trench a first polycrystalline silicon layer opposite the first dielectric layer for forming a storage capacitor with the adjacent portion of the silicon body; providing in each trench a second doped polycrystalline silicon layer that lies above the first polycrystalline silicon layer and that makes electrical contact with the first polycrystalline layer in the trench; diffusing dopants from the second polycrystalline layer into an adjacent portion of the silcon body for forming in the silicon body an output terminal for each pass transistor; forming in each trench a dielectric layer on the sidewall portion of the trench of the pass transistor and an oxide layer on top of the second polysilicon layer of the pass transistor and over the second polycrystalline layer; and forming in each trench a third polycrystalline silicon layer electrically isolated from the second polycrystalline silicon layer and adjacent to the gate dielectric for serving as the gate and gate contact of the pass transistor.

Although various illustrative embodiments of the invention are described in the context of fabricating the memory cell for use in DRAMs, the invention has broader applications. For example, the invention is applicable to other processes for forming a two-dimensional array of vertical trenches in a semiconductive body comprises forming over the top surface of the semiconductive body an array of parallel columns of bit lines, each including a conductive portion and a dielectric cap, filling the gaps between the columns with a dielectric fill, etching troughs in the dielectric fill down to the top surface of the semiconductive body where the vertical trenches are to be formed, and then etching the trenches selectively in the semiconductive body using the array of parallel columns and the remaining dielectric fill as a mask.

The invention will be better understood in the light of the following more detailed description of an illustrative embodiment taken in conjunction with the accompanying drawing.

The drawings are not to scale since it is desirable to exaggerate some dimensions for visual clarity.

DETAILED DESCRIPTION

It will be convenient to describe the novel memory cell and the process for its fabrication in the context of a single memory cell. Generally, a DRAM is essentially a silicon chip in which there are included both an array of memory cells arranged in orthogonal rows and columns and support circuitry needed to write information into selected individual memory cells, to refresh information stored in the memory cells, and to read out information randomly from selected individual memory cells.

Moreover, generally in manufacture, a large number of DRAMS are processed in parallel in a single wafer and the wafer is eventually diced-up to form individual chips, each serving as a single DRAM. In some instances there may be included multiple DRAMs in a single chip.

Figure 1:
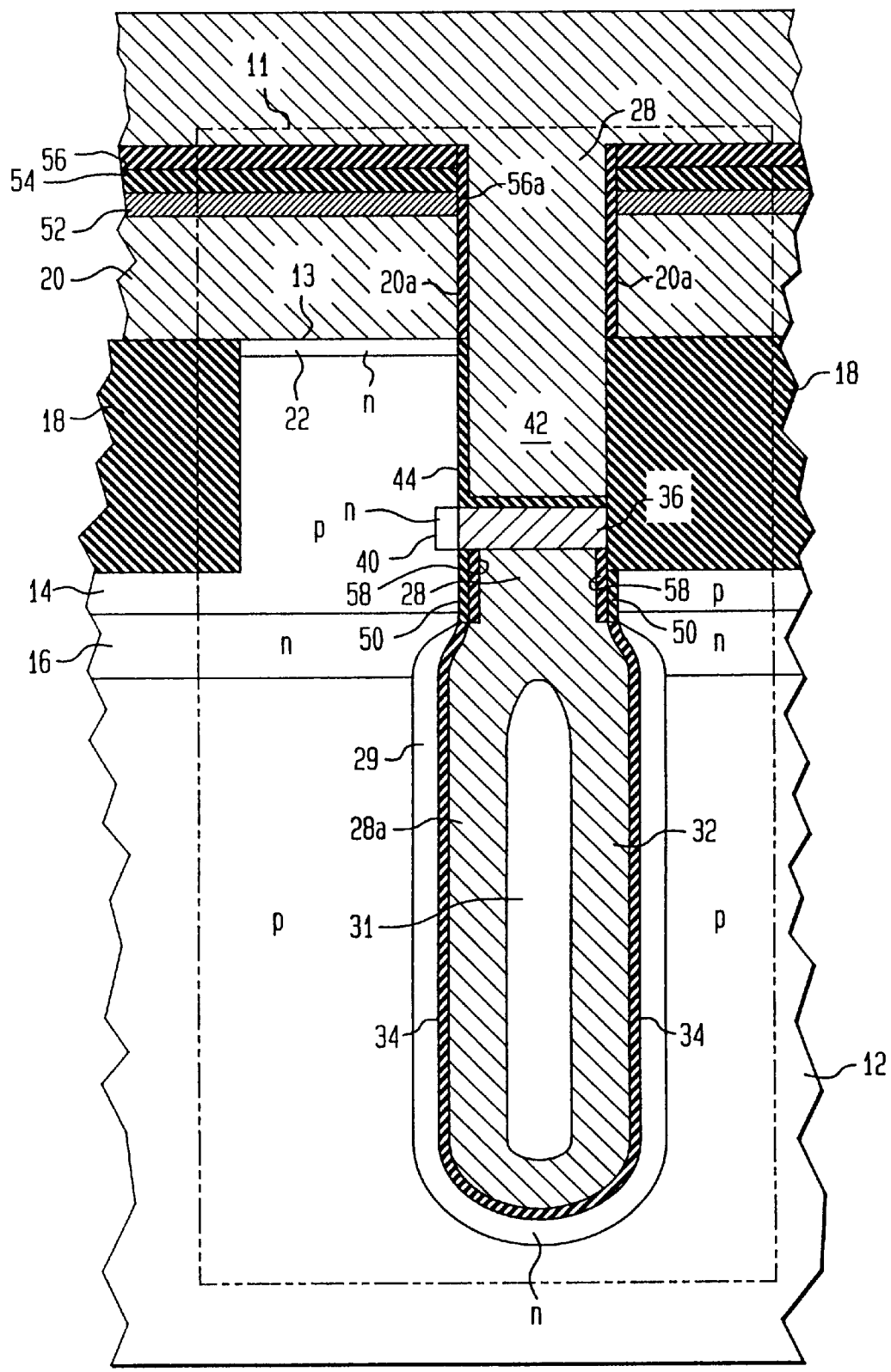
FIG. 1 shows a cross-sectional view portion of a portion of a semiconductor chip in which there has been formed the basic elements of a memory cell in accordance with the present invention.

Referring now to FIG. 1, there is shown in a cross-sectional view of a portion of a chip 10 which includes a switched capacitor memory cell 11 (shown within a dashed line rectangle) in accordance with an illustrative embodiment of the present invention. As shown, chip 10 is essentially a silicon body including a monocrystalline silicon substrate portion 12. The substrate portion 12 includes a p-type surface region (well) 14 that has been formed in an upper portion of the substrate 12 that typically is of higher p-type resistivity. The memory cell 11 of the present invention comprises a transistor (also denoted as a "pass transistor") and a capacitor (also denoted as a "storage capacitor"). The transistor is an enhanced mode field effect transistor (FET) and is typically an insulated gate field effect transistor (IGFET) that has a drain and a source of the same conductivity type which are separated by a channel region of the opposite conductivity type.

Illustratively the transistor in FIG. 1 is a n-channel IGFET having a drain 22 and a source 40 that are each of n-type conductivity, and a channel which is part of the well 14 and is of p-type conductivity. The transistor is described as vertical because its channel extends perpendicularly to the plane of the major surface of the silicon substrate (i.e., to top surface 13 of the body). A gate dielectric layer 44 overlies the channel and has a gate 42 covering the dielectric layer 44. A n+ type layer 29 (typically diffused) serves as a reference node (plate) of the capacitor of the memory cell 11 and typically is maintained at a reference potential by means of a contact (not shown) to a well 16 (which is connected to the layer 29) at a edge (not shown) of the chip 10 that leads to a d-c voltage source (not shown). Alternatively, an inversion layer in the substrate can be used as the reference plate. The n-type source 40 should be spaced enough away from the n-type well 16 that there is little or no leakage therebetween.

The chip 10 also includes at a top surface 13 a plurality of relatively shallow trenches 18 filled with a dielectric (e.g., silicon oxide). Trenches 18 are advantageously formed at an early stage of the processing to surround selected surface portions of the chip 10 and thereby to define an active surface region of an individual memory cell 11. The trenches 18 extend into the well 14 short of the well 16. The depth of the trenches is sufficiently deep to isolate the individual memory cells from each other. In one embodiment, the bottom of the trench is below the source 40 and above the reference node. Such shallow isolation trenches are now often used in state-of-the-art DRAMs to define the active surface region of an individual memory cell. Formation of shallow isolation trenches is described in Davari et al., "A new planarization technique using a combination of RIE and chemical-mechanical polish (CMP)", IEDM Tech. Dig. (1989) and Fuse et al., "A practical trench isolation technology with a novel planarization process", IEDM Tech. Dig. (1987) which are herein incorporated by reference for all purposes. Typically, the density of memory cells in a DRAM is increased by a decrease in the active surface area. An advantage of the present invention is that its novel design permits the use of active surface regions that are smaller in size than conventional designs. In particular, the invention ideally should make feasible the use of active surface regions having surface areas that are equal to about the minimum feature size possible by the available processing technology. Partially overlying each active surface region is a doped polysilicon layer 20 that provides an ohmic contact to a n-type surface layer 22 of the body that serves as the drain of the transistor of the memory cell 11. Over the layer 20 there is a highly conductive metallic silicide layer 52 (e.g., tungsten silicide) that provides a relatively low resistive bit-line. Over layer 52 is a cap layer 54 (e.g., silicon oxide, silicon nitride, or silicon oxynitride). An etch stop layer 56 overlies layer 54. A spacer layer 56a, e.g., of silicon nitride, covers the sidewall portion 20a that extends vertically along side wall 20a of layer 20. Below this spacer layer is the gate oxide layer 44 between the drain and source of the transistor and serving as the dielectric of the transistor.

The active surface region of the chip 10 includes an elongated vertical trench 28 for memory cell 11. The trench is largely filled with layers of polycrystalline silicon (polysilicon) and of dielectric to form the various parts of the vertical transistor and the storage capacitor in cooperation with portions of the adjacent monocrystalline substrate. The trench 28 extends beyond the well 16 into the original substrate portion 12.

Illustratively, the trench 28 is shown widened in a portion 28a thereof that extends through much of the n-type well 16 into the p-type substrate 12. By widening the lower portion of the trench, increase storage capacity is achieved. This enables a reduction in trench depth, decreasing raw process time required to form the trench. However, the use of such a trench is optional. Advantageously, polysilicon fill 32 in this deeper widened region 28a is of n-type conductivity and serves as a storage plate of the capacitor, which is a vertical capacitor. A highly doped n-type region 29 (or an inversion layer) in the body surrounds this widened trench portion 28a and serves as the reference plate of the storage capacitor which is electrically connected to well 16. An insulating layer 34, typically of silicon oxide, silicon nitride or both, covers the walls of the lower portion 28a of the trench 28 and serves as the dielectric of the capacitor by separating the two capacitor plates provided by region 29 (the reference plate) and the polysilicon fill 32 (the storage plate). A dielectric collar comprising dielectric layers 50 and 58 serve to isolate the trench fill 32 where the trench has its original narrower width.

Above the polysilicon fill layer 32 in the trench 28 is an additional donor-doped polysilicon fill layer 36 such that in processing, enough of the donor dopant diffuses out along its edge with monocrystalline p-type well 14, where there is no intervening dielectric, to form in the adjacent portion of the p-type well 14 the n-type region 40 that can serve as the source of the transistor. Layer 36 serves as an electrical contact to layer 32. Thus the source 40 of the vertical transistor is electrically coupled to the storage plate 32 of the capacitor. A conductive polysilicon layer 42 is included to fill the top-most portion of the trench 28. However, to electrically isolate this trench layer 42 from trench layer 36 and well 14, a silicon oxide layer 44 is provided both over the top of polysilicon fill layer 36 and the portion of the trench 28 that is contiguous with the well 14. The sidewall portion of oxide layer 44 along the well 14 between n-type source 40 and n-type drain 22 serves as a gate dielectric of the vertical transistor. The portion of polysilicon fill layer 42 adjacent thereto serves as the gate of the vertical transistor and the remainder as the gate contact and the word line. The polysilicon fill layer 42 extends in the plane of a word line (not shown) that extends in the plane of the drawing for interconnection with the other memory cells 11 in the same row as the depicted memory cell 11.

The shallow trench 18 that was formed initially advantageously extends to a depth below the depth of the source 40 but above that of the reference plate 29. In one embodiment, the bottom of the trench is between the top and bottom of the collar.

The layers 20 and 52 provide the drain contact to the n-type drain 22 and extend vertically to the plane of the drawing to serve as the bit line for interconnecting with the drain contact of the other memory cells 11 in the same column as the depicted memory cell 11. Typically, word lines and bit lines of the memory array are orthogonal to each other with one running over but being electrically isolated from the other.

As previously discussed, the source and drain in the transistor reverse roles as the flow of current through the channel of the transistor reverses. Accordingly, the source and drain of the transistor may be viewed as the two output terminals of a switch and the gate as a control electrode (gate) to "turn on" or "turn off" the flow of current between output terminals of the switch.

FIGS. 2–15 show the chip 10 in various stages of fabrication. In these figures the reference numerals used for the various elements will generally be 100 larger than the reference numerals used in FIG. 1 for corresponding elements when same exist. For example, substrate 12 of FIG. 1 is shown as substrate 112 in FIG. 2.

Figure 2:
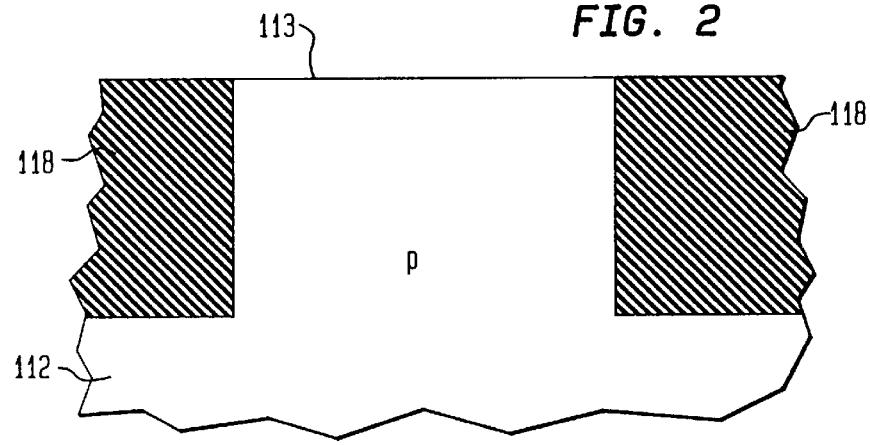
FIGS. 2–15 show in cross-sectional views portions of the semiconductor chip of FIG. 1 at successive stages in its processing in accordance with the present invention.

Referring to FIG. 2, the initial stage of forming the chip is shown. As shown, a suitable wafer, typically of high quality monocrystalline silicon that is of relatively high p-type resistivity, is prepared. The wafer, for example, is cut from an ingot. Preferably, the top surface of the wafer lies along a crystalline plane making it especially amenable to ion implantation and to etching that can readily be made either isotropic or anistropic, as desired, by appropriate choice of the etching process.

Then there are defined the active areas of the chips that will ultimately be formed by the dicing of the wafer, active areas being those surface regions where the memory cells and the support circuitry are to be formed. Such definition can be in any suitable fashion, typically by known lithographic techniques, and the individual active areas are then surrounded by a shallow trench 118. The top surface 113 is then covered with a dielectric, such as silicon oxide or a silicate glass, and then planarized to leave the substrate 112 with the shallow trenches 118 defining an active surface area 113.

Figure 3:
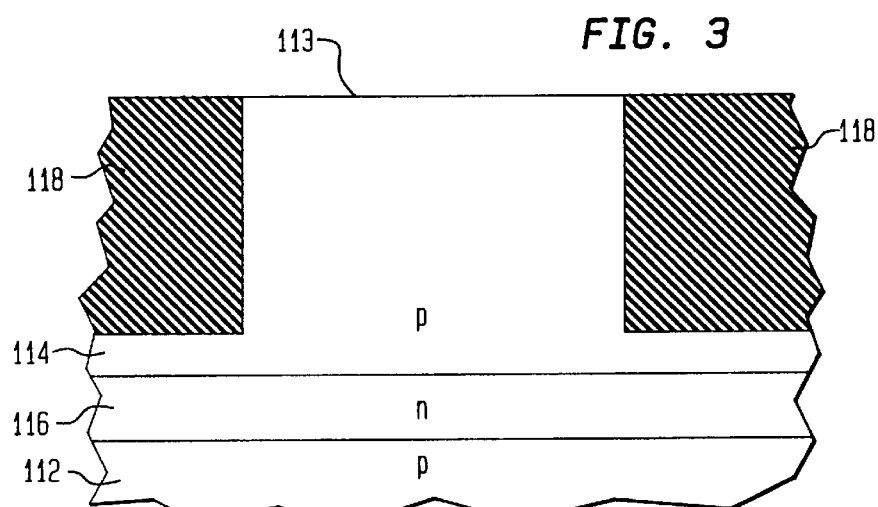

Advantageously, there is next formed in the wafer the various p-type and n-type wells, such as the surface p-type well 14 and the buried n-type well 16 that are shown in FIG. 1, typically by ion implantation followed by drive-in anneal. As known, it is generally advantageous to provide a sacrificial oxide over the wafer surface before such implantation to minimize damage to the surface of the crystal. FIG. 3 shows the body including a p-type well 114, an n-type well 116, and the substrate 112.

Advantageously, there are then formed on the surface 113 a pattern of conductive layers (conductors) 120 of n-type polysilicon that will eventually serve as part of columns of bit lines for the memory cells 11 of the chip 10.

Figure 4:
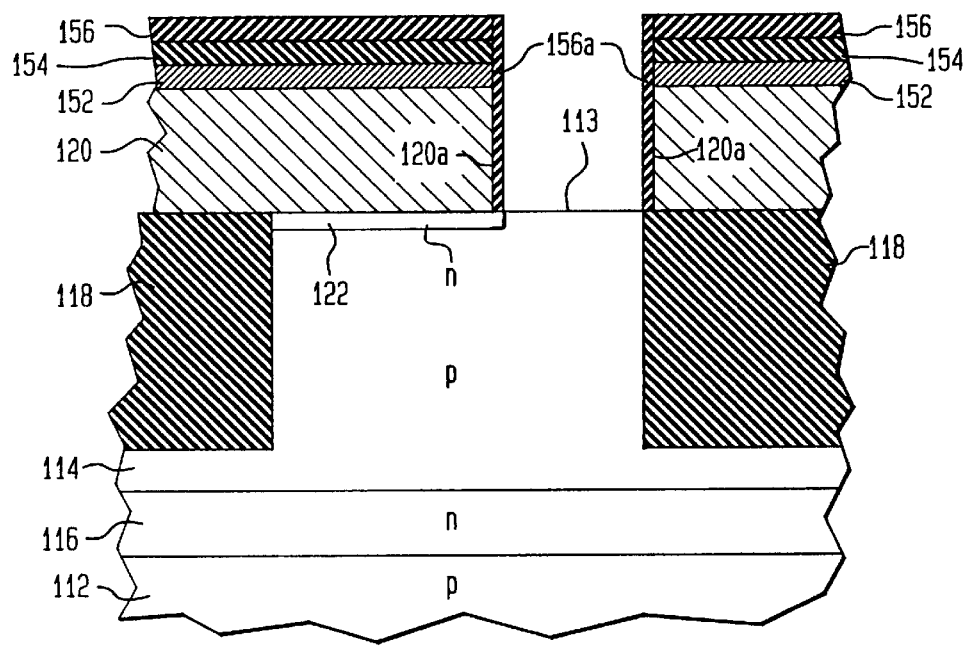

Advantageously, each layer 120 is doped so that, when heated appropriately, it will supply donor atoms that diffuse into the underlying p-type well 114 for forming therein n-type regions 122 that can serve as the drains of the n-channel transistors. Layer 120 is covered with a layer 152 of a highly conductive metallic silicide (e.g., tungsten silicide) that lowers the resistance of the bit lines. Next preferably there is added a cap layer 154, e.g., silicon oxide, silicon nitride, or silicon oxynitride. The stack is then covered with an etch stop layer 156. The multilayer is then patterned to form the desired bit lines and a spacer layer 156a, e.g., silicon nitride, is then added. The resultant is shown in FIG. 4.

Figure 5:
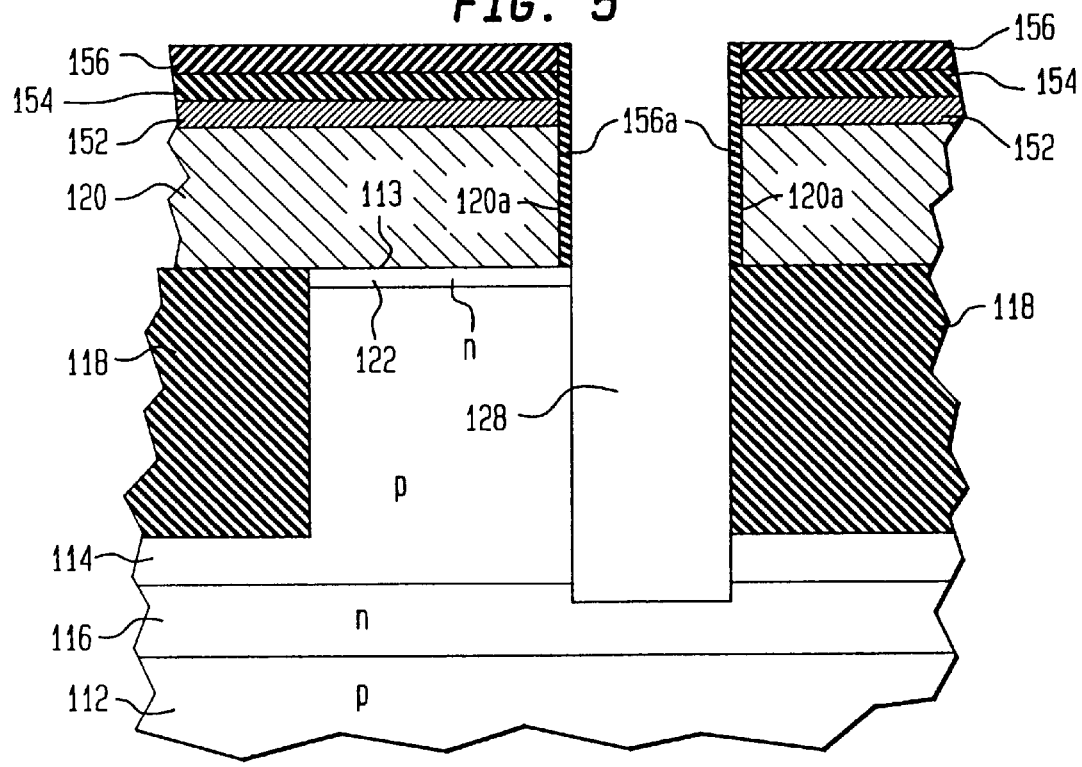

At this point, it is advantageous to fill the spaces between the bit line stacks with a dielectric, typically a doped silicate glass such as BPSG and to reflow or planarize the dielectric fill, as necessary for the following steps. There is then formed a word line pattern over the planarized surface to define regions where troughs are to be formed in the dielectric silicate glass down to the level of the semiconductive body and these troughs define the regions where the vertical trenches are to be formed. Referring to FIG. 5, a trench 128 is shown. As shown, trench 128 is etched to a depth through the p-well 114 and ending in the n-well 116.

It can be appreciated that the trench 128 is formed without the need for a separate mask. Instead, the vertical trench is self aligned to the word line and bit line in the overlap between word line and bit line space after formation of the troughs in the bit line fill as has been described.

The etching is done advantageously by anisotropic reactive ion etching (RIE) to form trenches that are relatively cylindrical in shape and that initially extend from surface 113 through well 114 and into the n-well 116.

Figure 6:
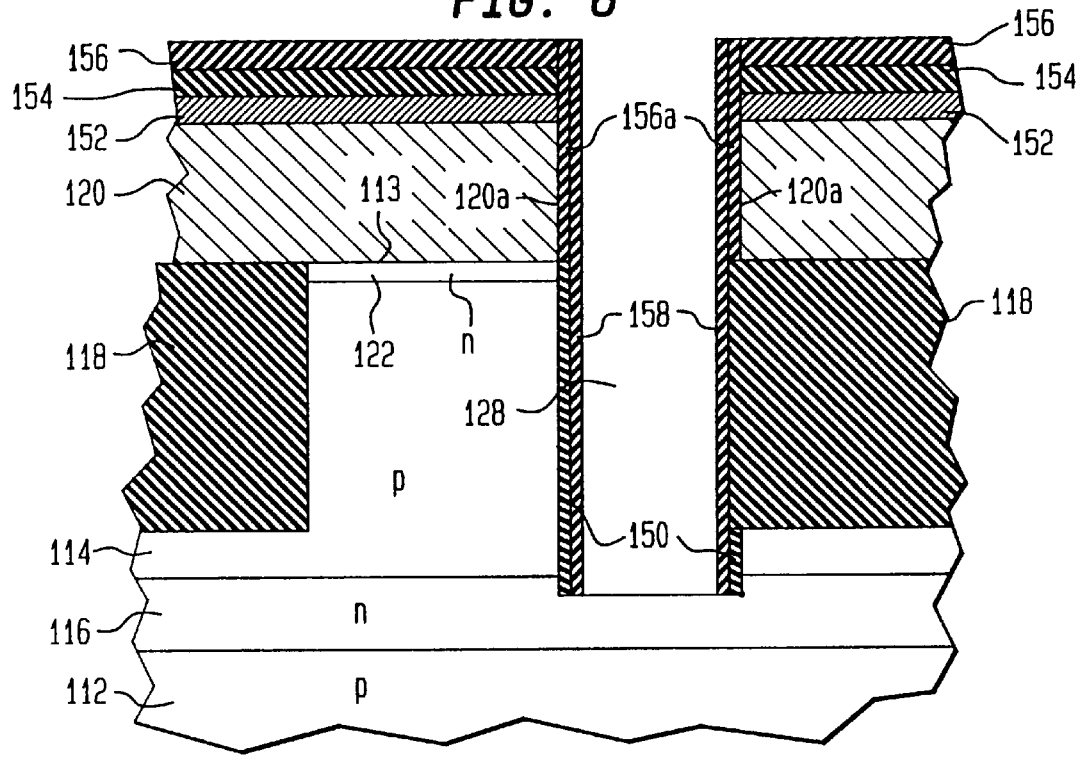

After such etching, there is formed a silicon dioxide layer 150 on exposed portions of wells 114 and 116 in the trench 128. A layer 158 of silicon nitride is then formed over the layers 156a and 150 on the sidewalls of the trench 128. The layers 150 and 158 are removed selectively from the bottom of the trench 128 by reactive ion etching. The resultant is shown in FIG. 6. Layer 158 helps to control the succeeding reactive ion etching step that is used both to deepen and broaden the trench 128 so that it penetrates through the n-type well 116 and terminates in the original substrate 112 that still has only the initial p-type doping. Advantageously, this etching is chosen to etch the silicon, where unprotected by the layer 158, first anisotropically to a desired depth and then isotropically so that the radius of the trench 128a is increased in the portion 128a of well 116 deeper than that protected by the dielectric layer 158.

Figure 7:
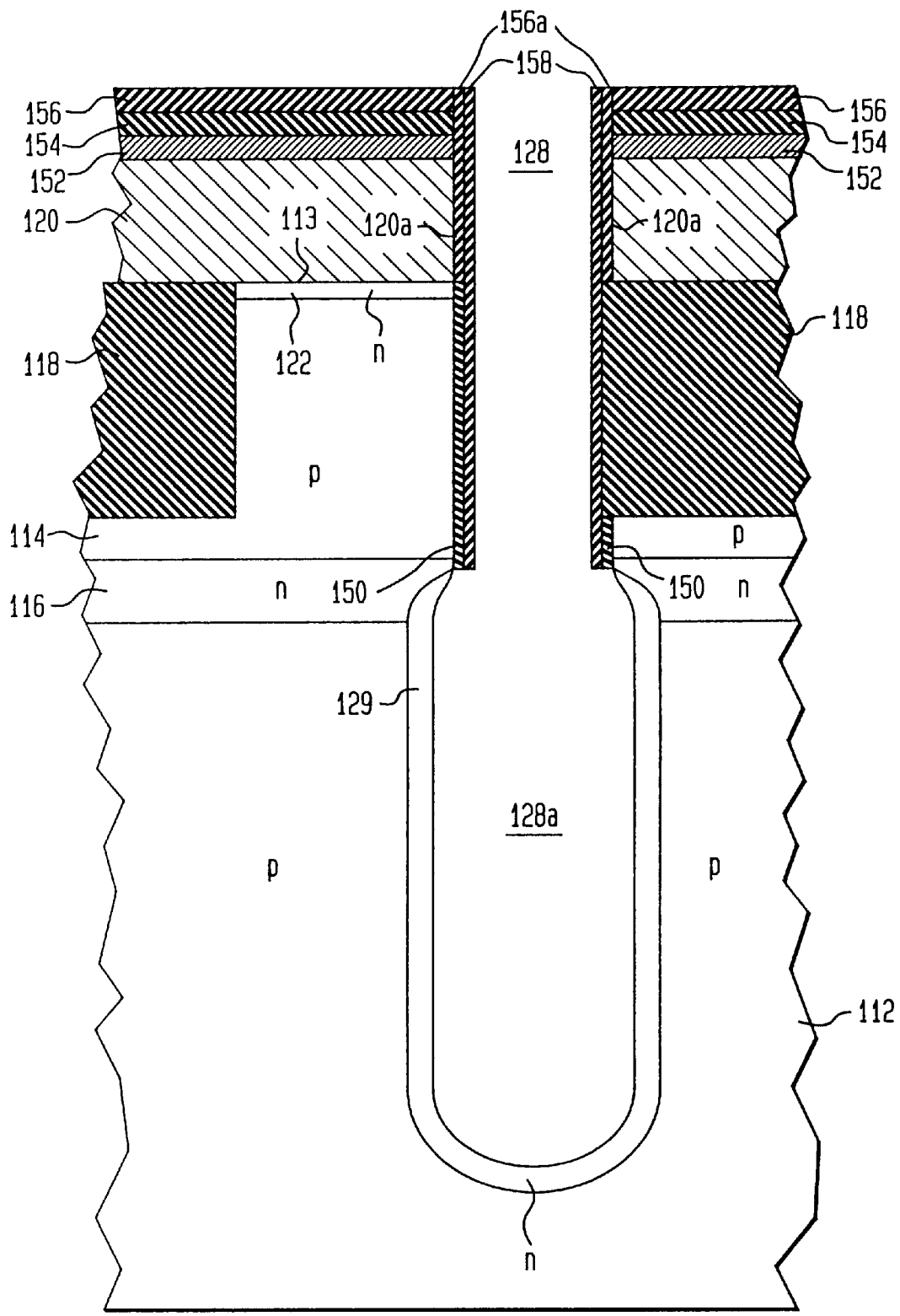

Advantageously, the walls of the unprotected deeper portion 128a of the trench 128 are n-doped (e.g., by gas diffusion) to form a n+ type region 129 that serves as the reference plate of the storage capacitor to increase the conductivity of the silicon to insure that the well 116 serves satisfactorily as the buried reference plate (node) when it is contacted (not shown) at the periphery (not shown) by a voltage supply terminal. FIG. 7 shows the enlarged radius of the lower trench portion 128a together with region 129.

Figure 8:
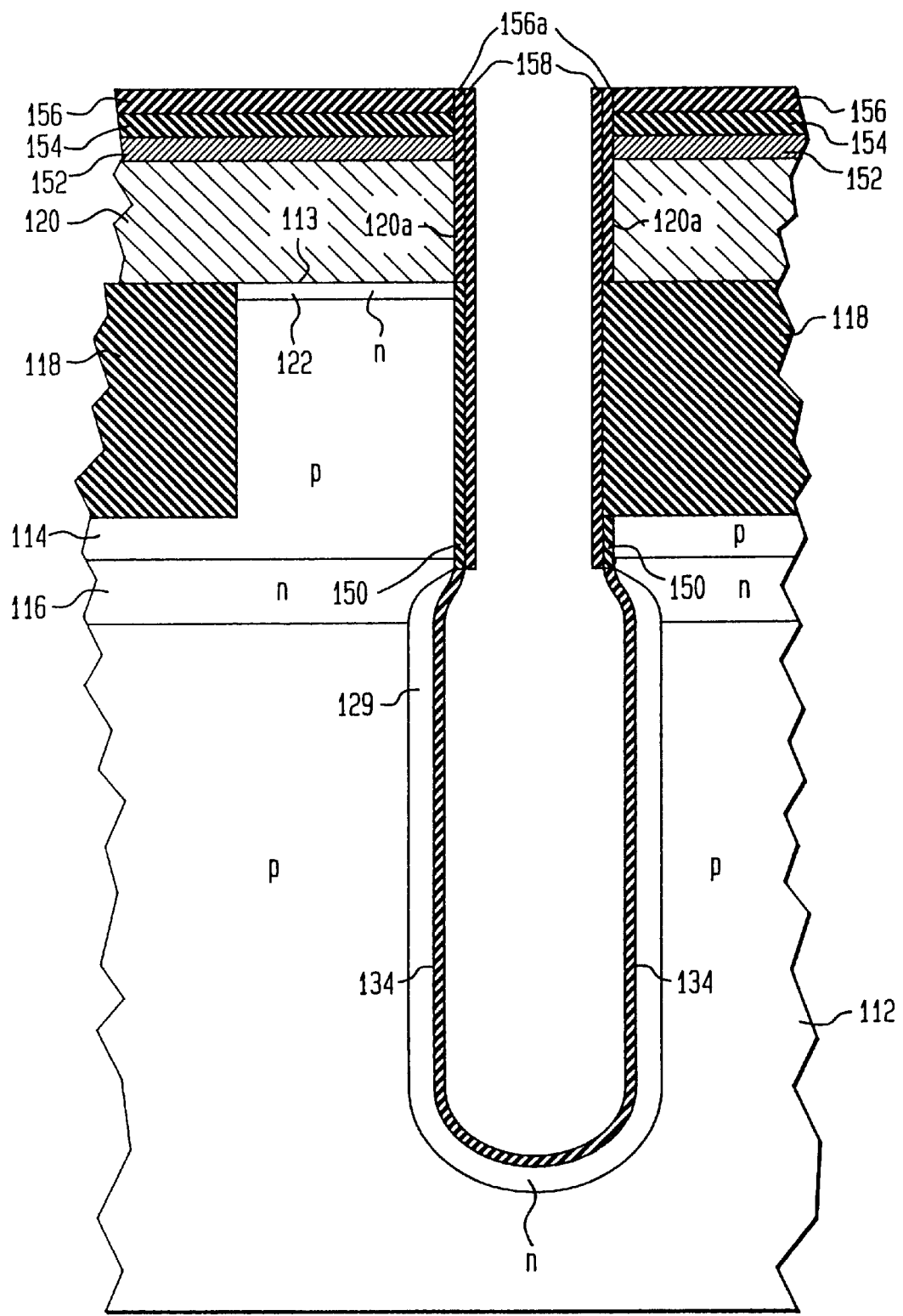

The capacitor dielectric film 134 is then formed on the wall of the portion of the trench 128 (128a) adjacent the layer 129. This typically can be done by depositing any suitable dielectric that can be deposited reliably. Advantageously, the film 134 can be a dual layer of silicon nitride and silicon oxide. FIG. 8 shows the dielectric film 134 in place on part of the trench 128 (128a) adjacent the region 129 walls with layer 158 still in place.

Figure 9:
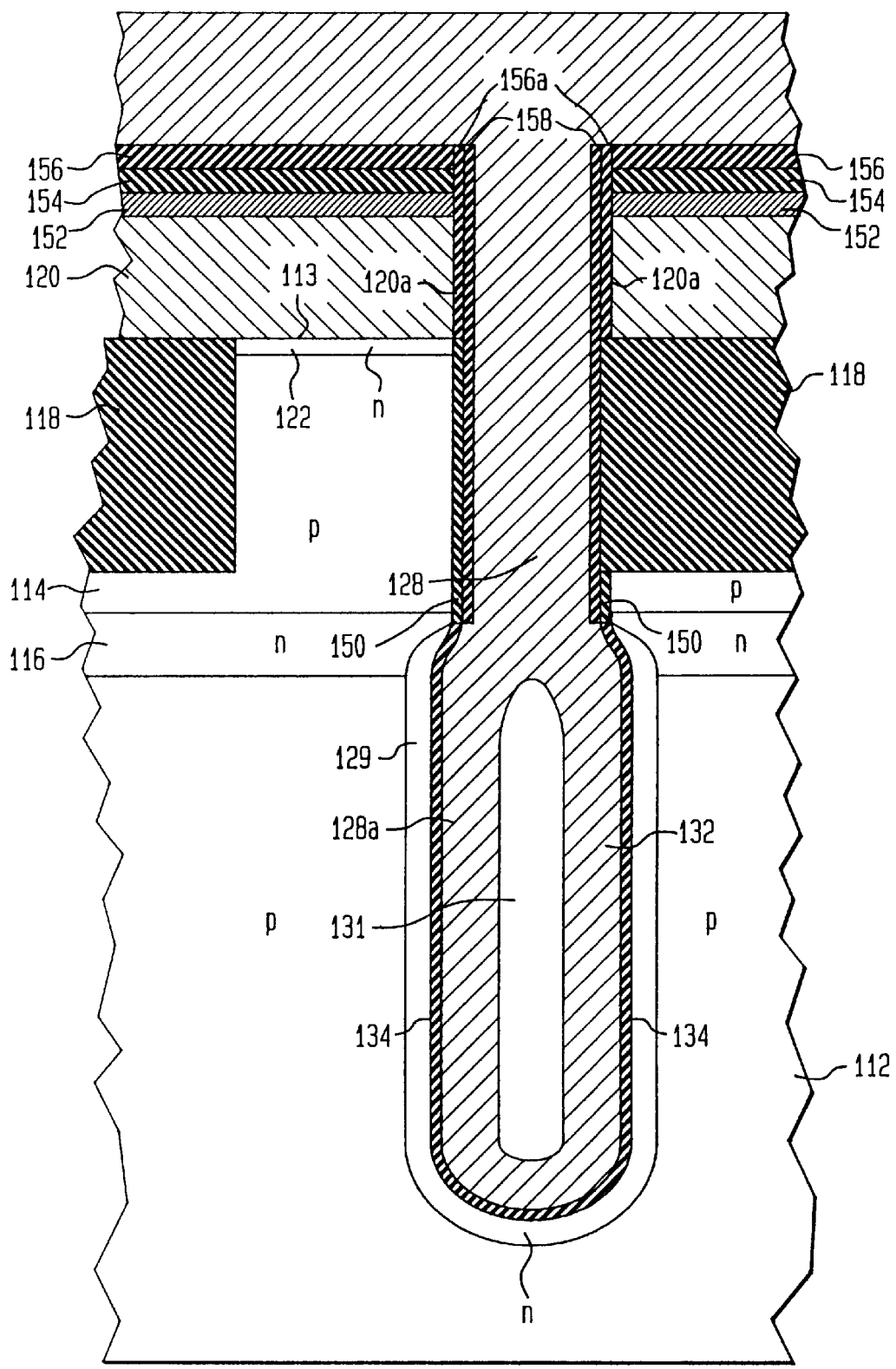

Next in known fashion, the wafer is heated in a gaseous atmosphere to deposit polysilicon, advantageously doped to be n-type conductivity, on the walls of the trench 128 including portion 128a to fill it as seen in FIG. 9. In practice, the trench 128 may not fill completely. For example, a hollow 131 may result during the trench fill, as is shown in FIG. 9. Although the void is present in the trench, it does not detrimentally affect the operation of the cell, as described in T. Ozaki et al., "0.228 $\mu m^2$ Trench Cell Technologies with Bottle-Shaped Capacitor for 1 Gbit DRAMs", IEDM Tech. Dig. (1995) which is herein incorporated by reference for all purposes.

Typically, the process of filling a trench with polysilicon involves depositing the polysilicon over the entire top surface of the chip and doing a chemical mechanical polish (CMP) to planarize the top surface so as to remove the polysilicon down to the top of the word line troughs.

Figure 10:
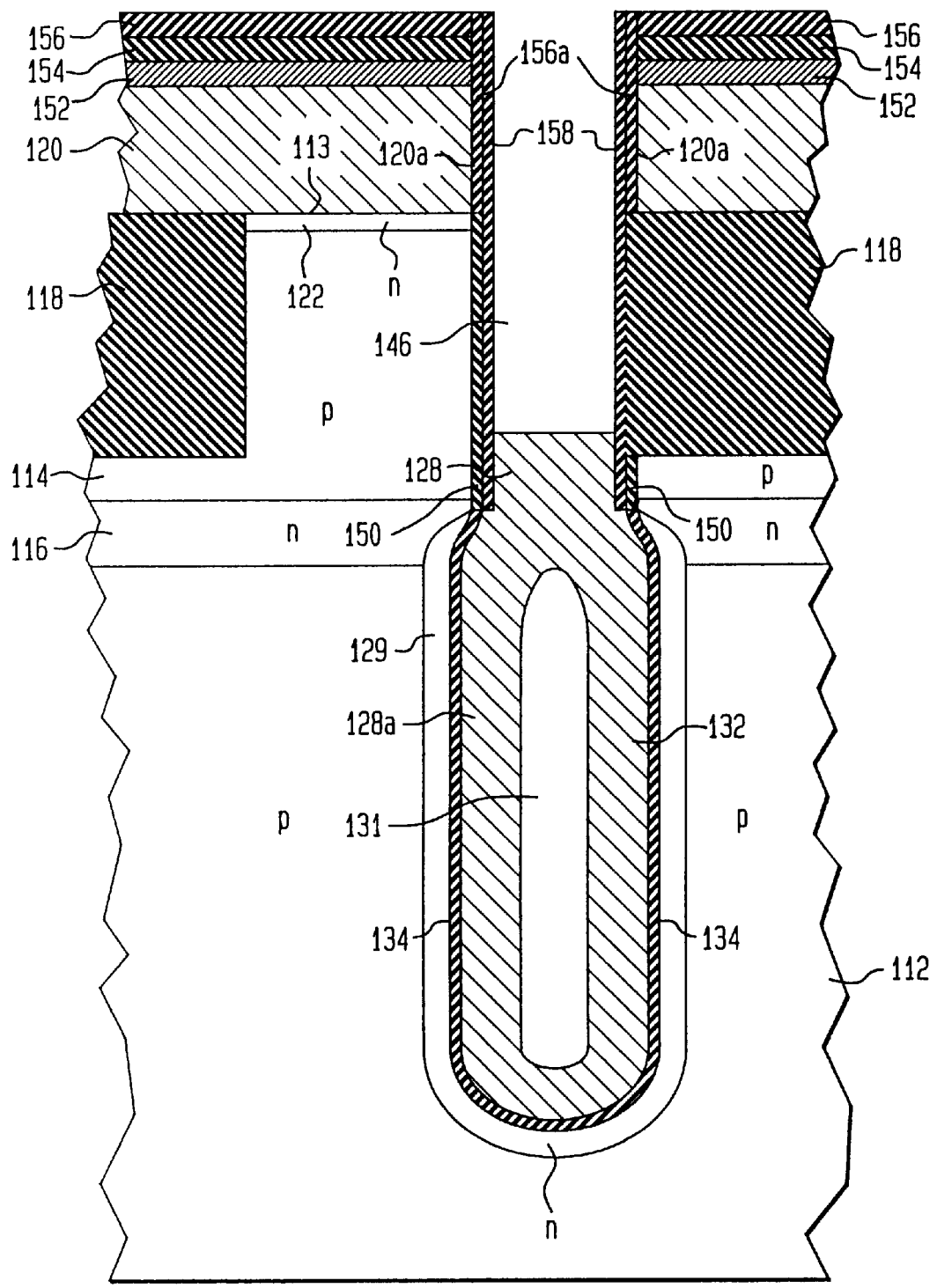
Figure 11:
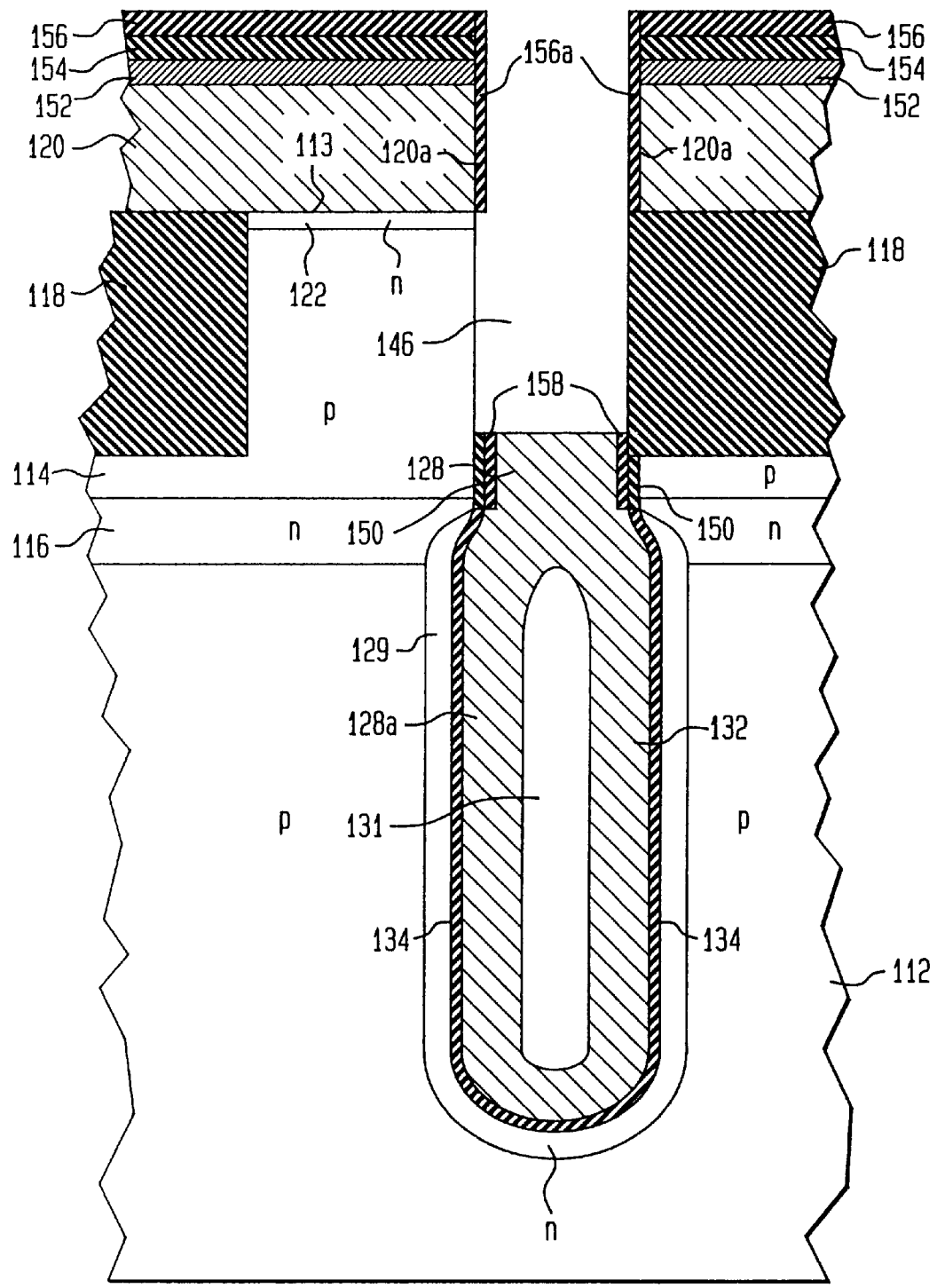
Figure 12:
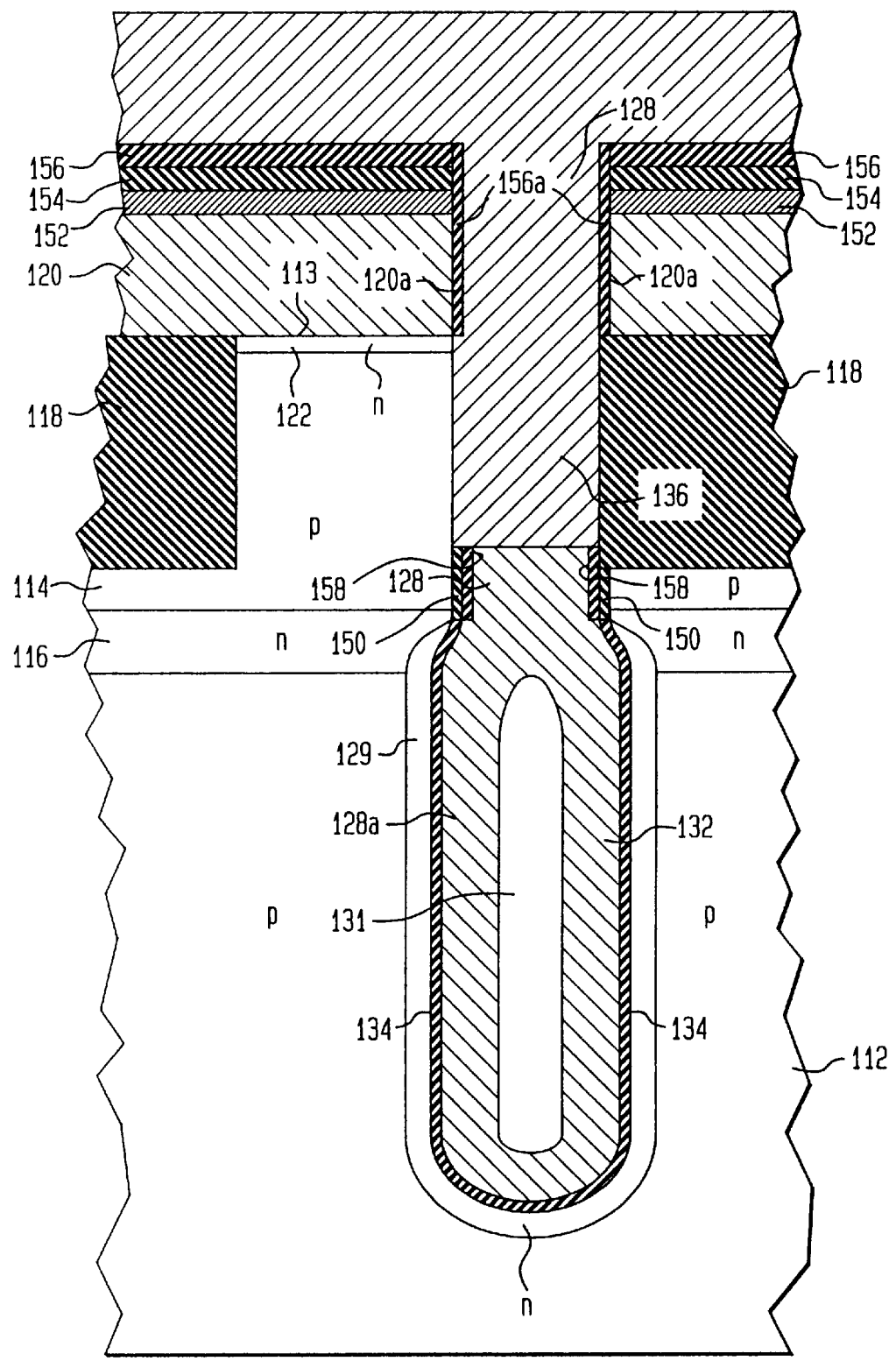

Next, as is shown in FIG. 10, reactive ion etching is used to remove selectively the polysilicon 132 in the trench 128 short of the top of the well 116, to form a recess 146 as is seen in FIG. 10. The layer 158 serves as an etch stop to protect the side walls it covers Then there is etched away the layers 150 and 158 in well 114, as is shown in FIG. 11. There then follows another deposition polysilicon 136 to refill the trench 128 to the top surface as seen in FIG. 12. The process of filling the trench may be the same as previously described for the earlier filling. This polysilicon 136 is designed to make electrical conductive contact to earlier polysilicon fill 132.

Figure 13:
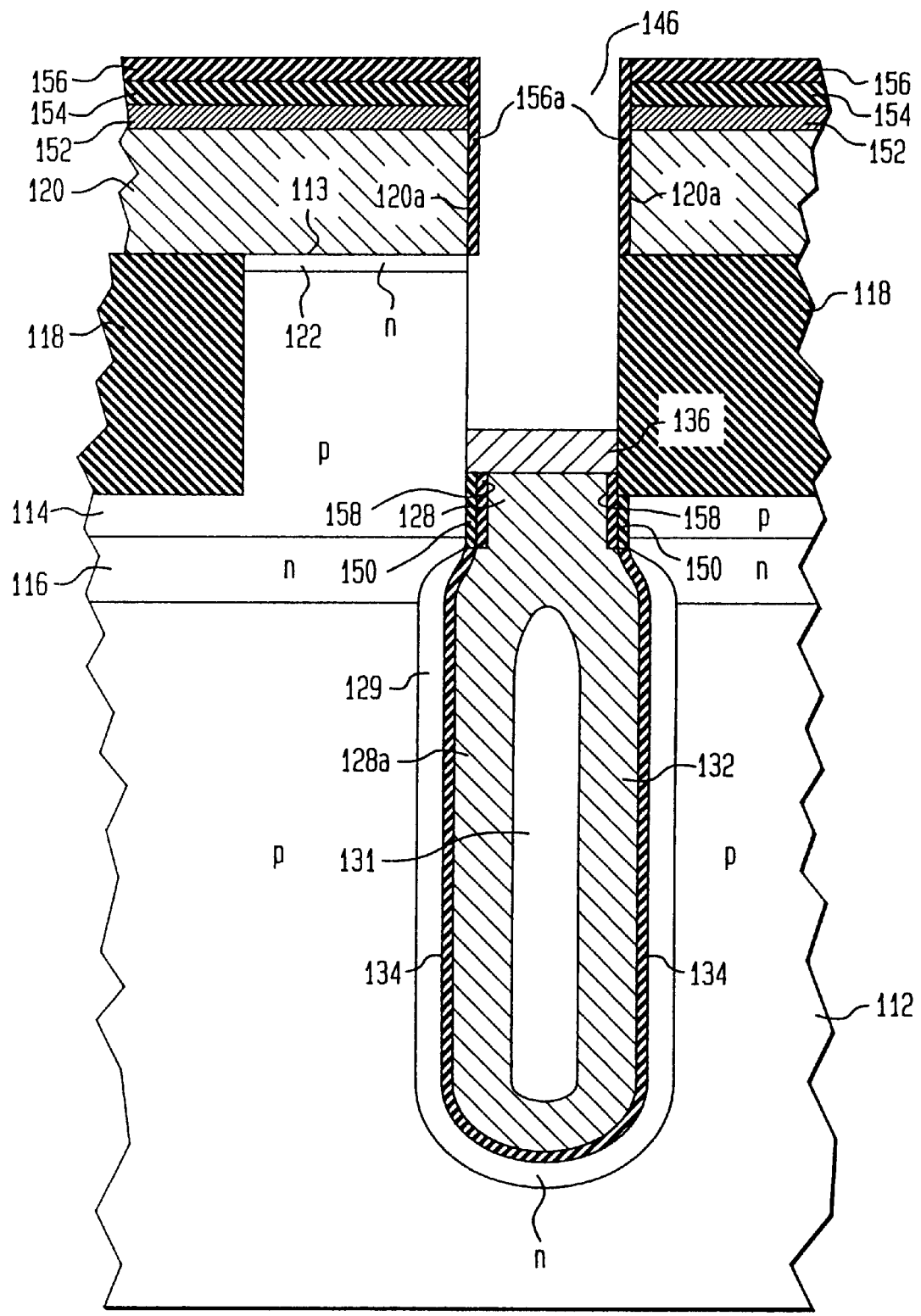

As is shown in FIG. 13, there is now formed another recess 146 again by reactive ion etching in the polycrystalline fill 136 in the trench 128 to a depth that will define the start of the channel of the vertical transistor. The recess should be such that there remains enough n-doped polysilicon 136 both to form a n-type conductivity diffused source 140 in the adjacent monocrystalline silicon of p-type conductivity well 114 when the wafer is appropriately heated and to serve adequately as the source contact to the source 140.

Figure 14:
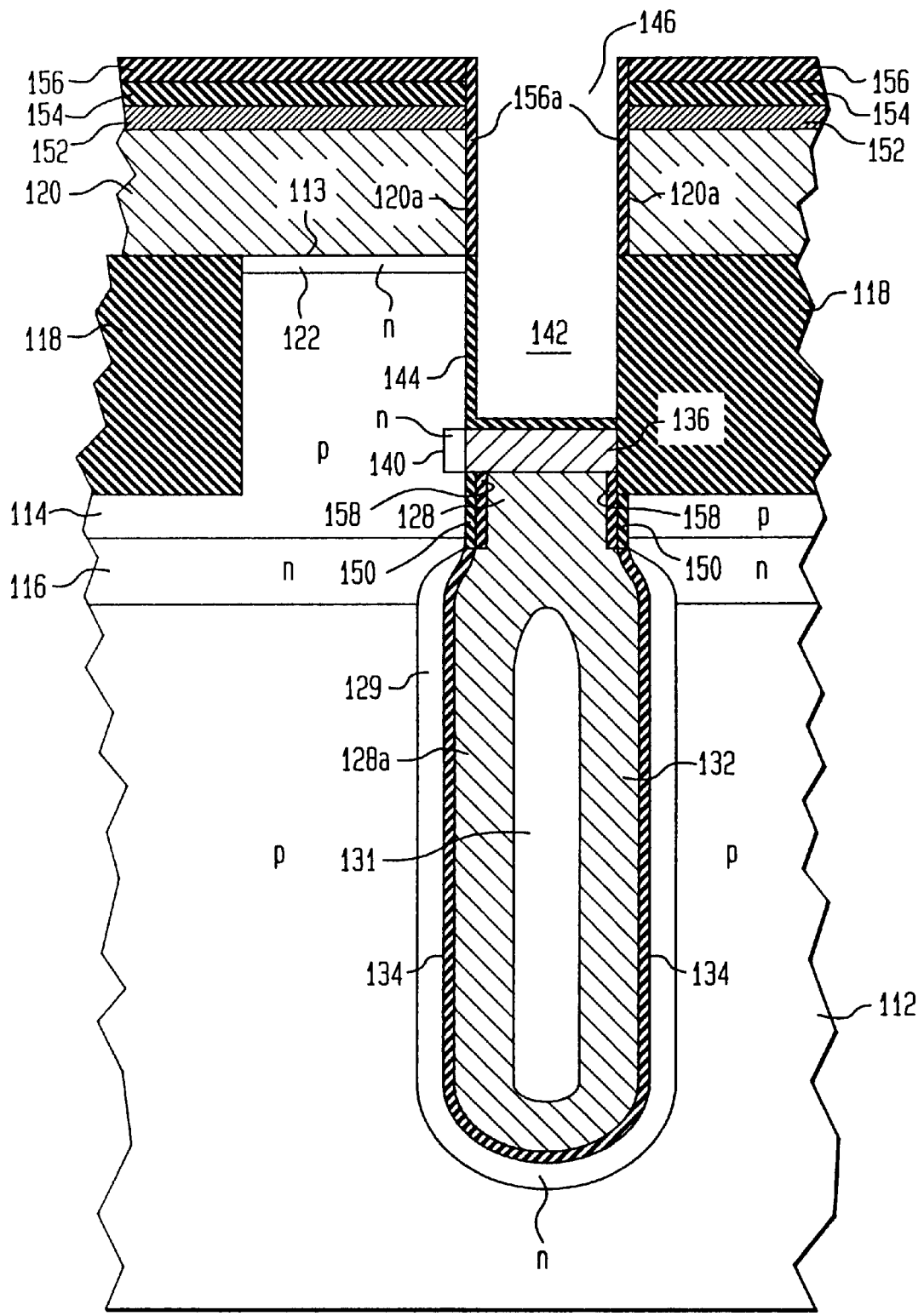

As shown in FIG. 14, after this last recess step, the surface of the recess 146 is oxidized including both its sidewalls and its bottom, to form a gate oxide 144 on the sidewall portion contiguous to the monocrystalline silicon and over the top of the n-doped polycrystalline fill 136, remaining in the trench 128. This will isolate the subsequent refill 142 of the recess 146 that serves as the gate and gate contact from the fill 136. The resultant is shown in FIG. 14 where the gate oxide layer 144 is seen extending between the source 140 and the n-type drain 122 that was formed by the out-diffusion of donor-dopants from the donor doped polysilicon contact 120. Alternatively, this drain can be formed by an ion implantation step early in the process.

Figure 15:
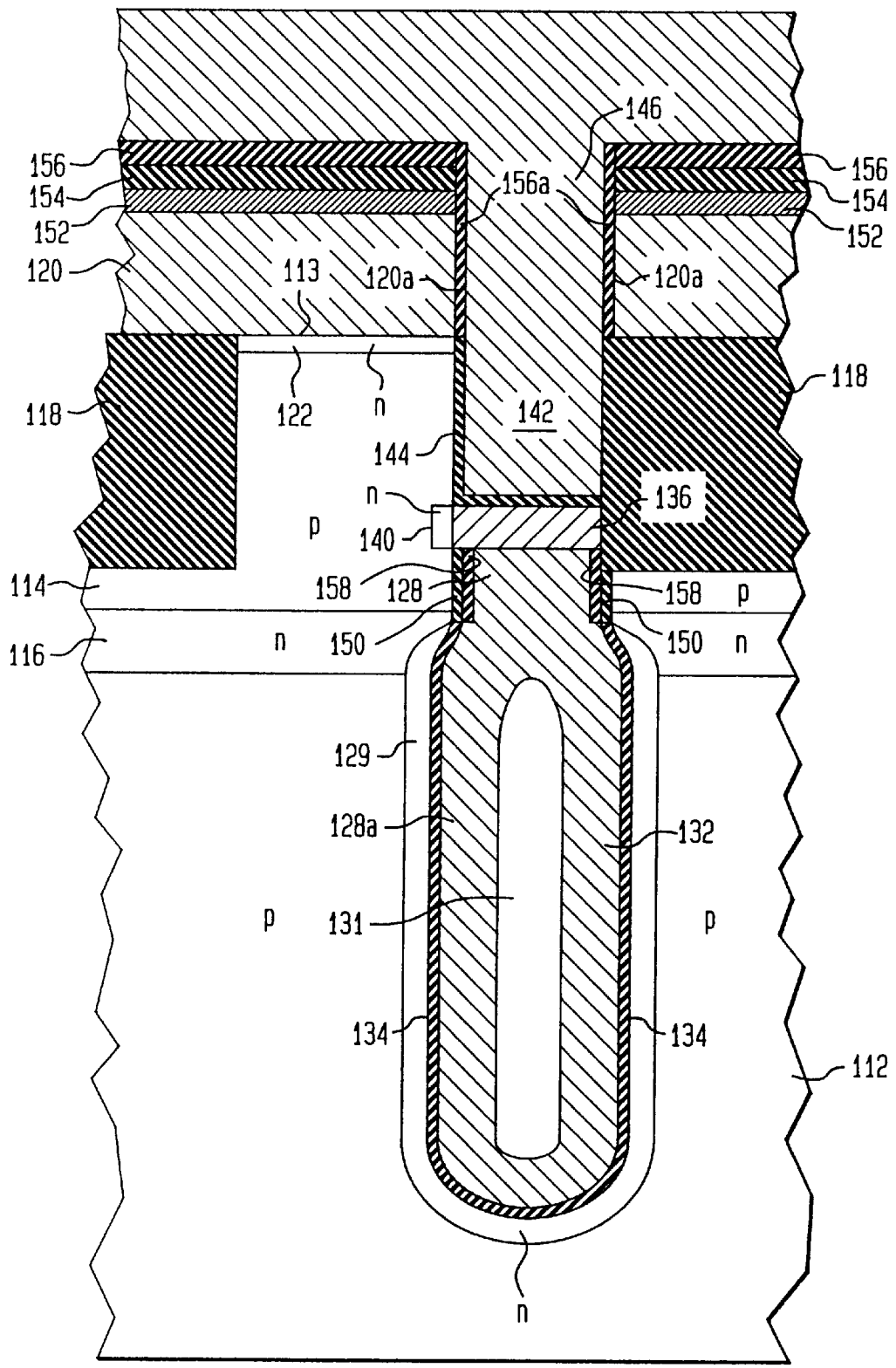

As is shown in FIG. 15, after formation of the gate oxide 144, the recess 146 in trench 128 and the word line trough are refilled with doped polysilicon 142 that will serve both as the gate and the gate contact and as part of the word line.

It should be understood that the specific embodiment described is illustrative of the general principles of the invention and that various changes are possible without departing from the scope of the invention. For example, it should be unnecessary to carry out all the various process steps involved in the same order as in the described preferred embodiment. This is particularly the case if one prefers to utilize more conventional approaches for locating the deep trenches, or the drain and drain contacts. Still further, while n-channel MOSFETS have been discussed for the preferred embodiment, p-channel MOSFETs can be substituted for the pass transistor. Moreover, in some instances, it may be preferrable to ground the substrate and operate the reference node at a fixed potential differing from ground. Furthermore, semiconductor material other than silicon is also useful.

What is claimed is:

1. A process for forming an array of memory cells each comprising a pass transistor and a storage capacitor for a dynamic random access memory in a portion of a silicon body in which there have been formed p-type and n-type conductivity wells and in which active areas for individual cells have been defined and isolated comprising the steps of:

forming at the top surface of the silicon body a source/drain for the pass transistor of each memory cell;

forming vertically in each active area a trench of a first depth that passes through a surface well of a first conductivity type and a buried well of the opposite conductivity type;

forming in each trench a first dielectric layer useful as the dielectric layer of a storage capacitor on a sidewall along a portion of the trench in the buried well;

providing in each trench a first polycrystalline silicon layer opposite the first dielectric layer for forming a storage capacitor with the adjacent portion of the silicon body;

providing in each trench a second doped polycrystalline silicon layer that lies above the first polycrystalline silicon layer and that makes electrical contact with the first polycrystalline layer in the trench;

diffusing dopants from the second polycrystalline layer into an adjacent portion of the silicon body for forming in the silicon body an output terminal for each pass transistor;

forming in each trench a dielectric layer on the sidewall portion of the trench of the pass transistor and an oxide layer on top of the second polysilicon layer of the pass transistor and over the second polycrystalline layer; and forming in each trench a third polycrystalline silicon layer electrically isolated from the second polycrystalline silicon layer and adjacent to the gate dielectric for serving as the gate and gate contact of the pass transistor.

2. The process of claim 2 in which the trench is formed by first etching anisotropicallly a trench of a first cross section, coating the walls of the trench with an etch-resistant coating, removing the coating from the bottom of the trench, etching anisotropically to deepen the trench, and then etching isotropically to widen the deepened portion of the trench.

3. The process of claim 2 in which each active area has been defined by a shallow trench of silicon oxide.

4. The process of claim 3 in which the various polysilicon layers are formed in turn by filling the trench, forming a first recess in the trench, refilling the recess, forming a second shallower recess in the trench and then refilling the shallower recess.

5. The process of claim 3 in which the forming of the vertical trenches in the semiconductive body comprises forming over the top surface of the body an array of columns of bit lines, each including a conductive portion and a dielectric cap, filling the gaps between the columns with a dielectric fill, etching troughs in the dielectric fill down to the top surface of the semiconductive body, and using the array of parallel columns and the remaining dielectric fill as a mask to etch the vertical trenches.

* * * * *